United States Patent
Huang et al.

(10) Patent No.: US 9,099,985 B2
(45) Date of Patent: Aug. 4, 2015

(54) POWER DIVIDER AND RADIO-FREQUENCY DEVICE

(71) Applicant: Wistron NeWeb Corporation, Hsinchu (TW)

(72) Inventors: Guo-Shu Huang, Hsinchu (TW); I-Shan Chen, Hsinchu (TW)

(73) Assignee: Wistron NeWeb Corporation, Hsinchu Science Park, Hsinchu (TW)

( * ) Notice: Subject to any disclaimer, the term of this patent is extended or adjusted under 35 U.S.C. 154(b) by 174 days.

(21) Appl. No.: 14/054,841

(22) Filed: Oct. 16, 2013

(65) Prior Publication Data

US 2015/0029072 A1 Jan. 29, 2015

(30) Foreign Application Priority Data

Jul. 24, 2013 (TW) .............................. 102126517 A (51) Int. Cl.
| | |
|---|---|
| *H01Q 21/00* | (2006.01) |
| *H01Q 1/38* | (2006.01) |
| *H01Q 1/50* | (2006.01) |
| *H03H 7/38* | (2006.01) |
| *H01Q 9/04* | (2006.01) |
| *H01Q 21/06* | (2006.01) |

(52) U.S. Cl.
CPC ................ *H03H 7/383* (2013.01); *H01Q 1/38* (2013.01); *H01Q 9/0407* (2013.01); *H01Q 21/0075* (2013.01); *H01Q 21/065* (2013.01)

(58) Field of Classification Search
CPC ............ H01Q 21/065; H01Q 21/0075; H01Q 9/0407; H01Q 1/38; H03H 7/383
See application file for complete search history.

(56) References Cited

U.S. PATENT DOCUMENTS

| | | | | |
|---|---|---|---|---|
| 3,987,455 | A  * | 10/1976 | Olyphant, Jr. | ................ 343/829 |
| 3,995,277 | A  * | 11/1976 | Olyphant, Jr. | ................ 343/846 |
| 4,180,817 | A  * | 12/1979 | Sanford | ................. 343/700 MS |
| 6,121,930 | A    | 9/2000  | Grangeat | |
| 6,828,939 | B2 * | 12/2004 | Li | .......................... 343/700 MS |
| 6,859,176 | B2 * | 2/2005  | Choi | ...................... 343/700 MS |
| 7,589,675 | B2 * | 9/2009  | Chang et al. | ........... 343/700 MS |
| 7,839,350 | B2 * | 11/2010 | Nagai | ........................... 343/850 |
| 7,868,828 | B2 * | 1/2011  | Shi et al. | ................ 343/700 MS |
| 7,920,094 | B2 * | 4/2011  | Hansen | ................. 343/700 MS |
| 2011/0260771 | A1 * | 10/2011 | Hirota et al. | .................. 327/360 |

OTHER PUBLICATIONS

Kin-Lu Wong, "Compact and Broadband Microstrip antennas", 2002 by John Wiley & Sons, Inc., New York, cover page and p. 92-111, 261-267.
You-Chien Chen and Powen Hsu, "CPW-fed folded slot dipole antenna for mobile handset applications", 2011 IEEE International Symposium on Antennas and Propagation, p. 1932-1935, Jul. 3-8, 2011.

* cited by examiner

*Primary Examiner* — Trinh Dinh
(74) *Attorney, Agent, or Firm* — Winston Hsu; Scott Margo (57) ABSTRACT

A power divider for transmitting signals of an input terminal to a plurality of output terminals includes a rectangular microstrip line coupled to the input terminal, and a plurality of coupling units conducting the rectangular microstrip line and the plurality of output terminals by electromagnetic coupling, wherein each of the plurality of coupling units and the rectangular microstrip line are separated by a first gap, and each coupling unit includes at least one dual-L resonator disposed between the microstrip line and an output terminal, wherein the first gap and a second gap of each dual-L resonator are related to a power ratio between the input terminal and the plurality of output terminals.

10 Claims, 13 Drawing Sheets

POWER DIVIDER AND RADIO-FREQUENCY DEVICE

BACKGROUND OF THE INVENTION

1. Field of the Invention

The present invention relates to a power divider and a radio-frequency device, and more particularly, to a power divider and a radio-frequency device capable of enhancing performance of the array antenna and effectively minimizing required area.

2. Description of the Prior Art

An array antenna is an antenna system composed of a plurality of identical antennas arranged in accordance with a specific rule, and has been widely used in a radar system, such as a millimeter-wave or micrometer-wave radar system. In order to achieve specific radiation patterns or satisfy specific weighting among the antennas in the array antenna, the prior art adds filters concatenated to input terminals of the array antenna, which serve as a power divider for achieving required amplitude and phase of each radiation entity. In general, the array antenna and the power divider are individually designed and then directly concatenated; therefore, the array antenna and the power divider of the prior art can hardly be integrated efficiently. Moreover, impedance matching issues must be taken into account as well. Although an additional designed matching circuit may alleviate mismatch and improve performance, price is quite high—for example, area increases, cost rises and antenna gain is reduced, thereby shortening radar detecting distance and limiting scanning angle.

Therefore, enhancing performance of the array antenna and effectively minimizing required area at the same time is a significant objective in the field.

SUMMARY OF THE INVENTION

It is therefore a primary objective of the present invention is to provide a power divider and a radio-frequency device, which enhance performance of an array antenna and effectively minimize required area at the same time.

An embodiment of the invention provides a power divider. The power divider for transmitting signals of an input terminal to a plurality of output terminals includes a rectangular microstrip line coupled to the input terminal, and a plurality of coupling units conducting the rectangular microstrip line and the plurality of output terminals by electromagnetic coupling, wherein each of the plurality of coupling units and the rectangular microstrip line are separated by a first gap, and each of the plurality of coupling units coupling unit includes at least one dual-L resonator disposed between the microstrip line and an output terminal of the plurality of output terminals. Each of the at least one dual-L resonator comprises a first long segment substantially parallel to the rectangular microstrip line, a first short segment substantially perpendicular to the first long segment and extending from a terminal of the first long segment to a centerline of the dual-L resonator, a second long segment substantially parallel to the rectangular microstrip line and a second short segment substantially perpendicular to the second long segment, extending from a terminal of the second long segment to the centerline, facing a terminal of the first short segment, and located apart from the terminal of the first short segment by a second gap. A first long segment of the at least one dual-L resonator is adjacent to the rectangular microstrip line, and a second long segment of the at least one dual-L resonator is coupled to the output terminal. The first gap and the second gap are related to power ratios between the input terminal and the plurality of output terminals.

An embodiment of the invention provides a radio-frequency device including a power divider and a plurality of antennas. The power divider for transmitting signals of an input terminal to a plurality of output terminals includes a rectangular microstrip line coupled to the input terminal, and a plurality of coupling units conducting the rectangular microstrip line and the plurality of output terminals by electromagnetic coupling, wherein each of the plurality of coupling units and the rectangular microstrip line are separated by a first gap, each of the plurality of coupling units comprises at least one dual-L resonator disposed between the rectangular microstrip line and an output terminal of the plurality of output terminals, and each of the at least one dual-L resonator comprises a first long segment substantially parallel to the rectangular microstrip line, a first short segment substantially perpendicular to the first long segment and extending from a terminal of the first long segment to a centerline of the dual-L resonator, a second long segment substantially parallel to the rectangular microstrip line, and a second short segment substantially perpendicular to the second long segment, extending from a terminal of the second long segment to the centerline, facing a terminal of the first short segment, and located apart from the terminal of the first short segment by a second gap. A first long segment of the at least one dual-L resonator is adjacent to the rectangular microstrip line, and a second long segment of the at least one dual-L resonator is coupled to the output terminal. The plurality of antennas coupled to the plurality of output terminals. Each of the plurality of the antennas comprises a plurality of radiator elements and a plurality of extending segments. Each of the plurality of the radiator elements is substantially quadrilateral and has a first side, a second side, a third side and a fourth side, the first side is substantially parallel to the third side, the second side is substantially parallel to the fourth side, and the first side is substantially perpendicular to the second side, wherein a first concavity is formed on the second side of each of the plurality of the radiator elements, and a second concavity is formed on the fourth side of each of the plurality of the radiator elements. Each of the extending segments extends from the second concavity of the fourth side of one of the plurality of radiator elements to the first concavity of the second side of another one of the plurality of radiator elements such that the plurality of radiator elements are arranged in a sequence. The first concavity of the second side of a radiator element located at a first place of the sequence and one of the plurality of output terminals are separated by a third gap. The first gap, the second gap and the third gap are related to power ratios between the input terminal and the plurality of output terminals.

These and other objectives of the present invention will no doubt become obvious to those of ordinary skill in the art after reading the following detailed description of the preferred embodiment that is illustrated in the various figures and drawings.

DETAILED DESCRIPTION

To solve drawbacks in the prior art, the present invention integrates a power divider with an array antenna, and uses a coplanar waveguide (CPW) coupling structure to connect the power divider and an antenna by coupling. Accordingly, extra matching circuits near a crucial joint between the power divider and the array antenna are not necessary, thereby effectively minimizing area, reducing transmission loss, achieving high gain, increasing detecting angle and saving manufacturing cost. In addition, since the array antenna and the power divider of the present invention may be integrated into a functional block, process variations during system design are reduced to enhance stability. Moreover, the power divider may serve as filters so as to increase frequency selectivity and be isolated from undesirable signal sources. Furthermore, the present invention adds a plurality of resonators to offer frequency response of boarder bandwidth and effectively improve impedance matching.

Figure 1A:
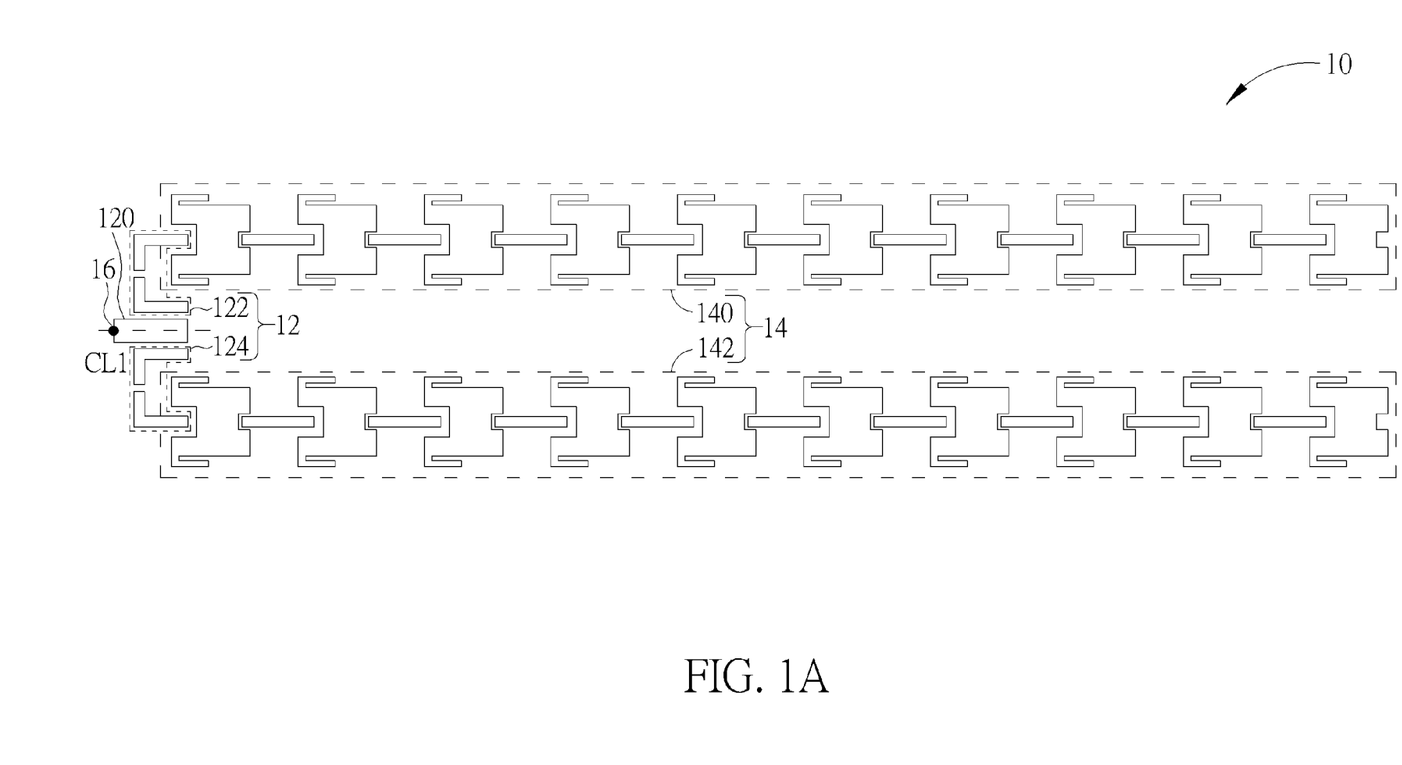
FIG. 1A is a schematic diagram illustrating a radio-frequency device according to an embodiment of the present invention.

In detail, please refer to FIG. 1A, which is a schematic diagram of a radio-frequency device 10 according to an embodiment of the present invention. The radio-frequency device 10 comprises a power divider 12 and an array antenna 14. The power divider 12 transmits signals from an input terminal 16 to the array antenna 14. The power divider 12 comprises a rectangular microstrip line 120 and coupling units 122, 124. The array antenna 14 comprises antennas 140, 142. In this embodiment, structures of the power divider 12 and the array antenna 14 are symmetrical with respect to a centerline CL1 of the rectangular microstrip line 120. In other words, structure of the coupling unit 122 is exactly the same as that of the coupling unit 124, and a structure of the antenna 140 is exactly the same as that of the antenna 142. Moreover, the antennas 140, 142 are formed from a sequence composed of identical radiator elements and identical extending segments. For the sake of brevity, details about the power divider 12 and the array antenna 14 are described by focusing on the front of the coupling units 122 and the antenna 140. Nevertheless, it is worth noting that the radio-frequency device 10 shown in FIG. 1 is merely an embodiment, which aims to illustrate the concept of the present invention exemplarily but not limited thereto.

Figure 1B:
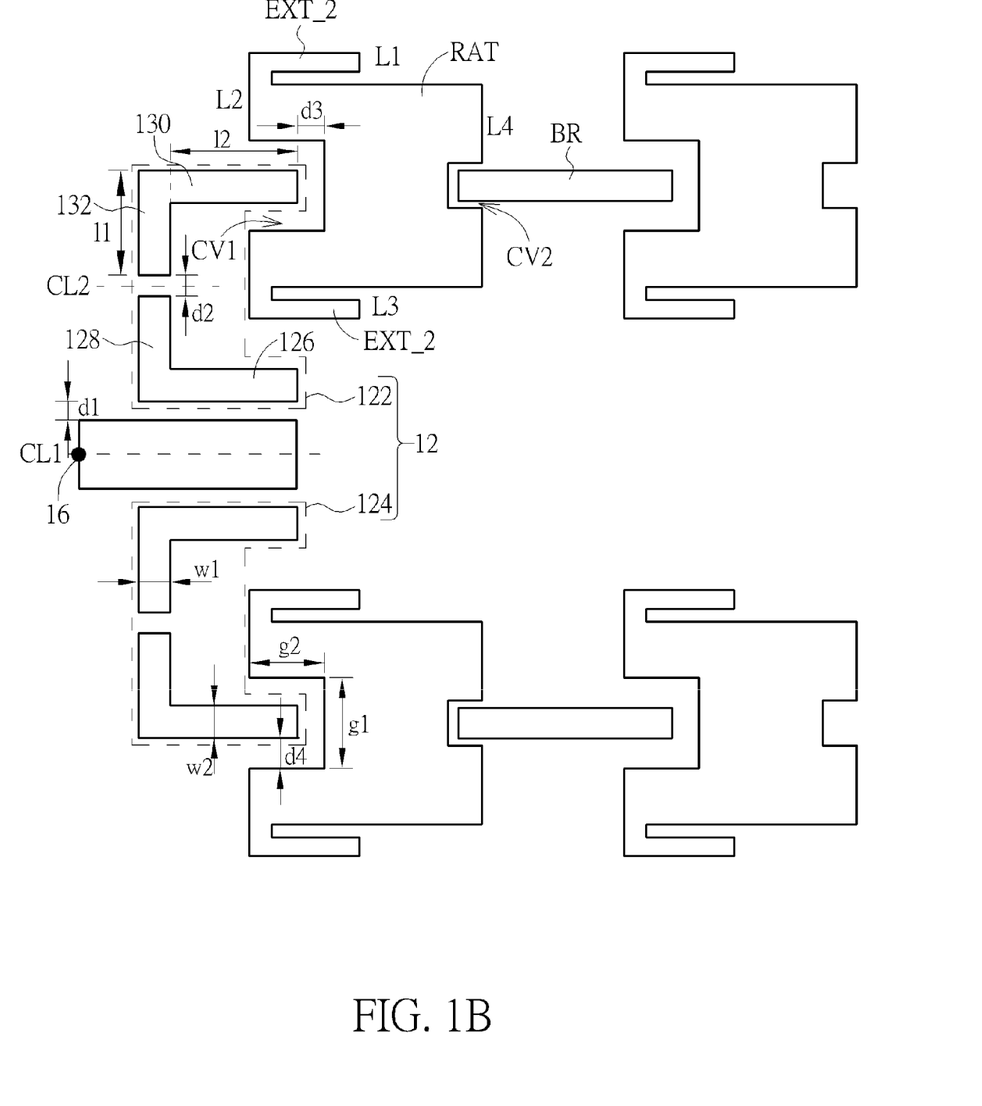
FIG. 1B is a schematic diagram illustrating a locally enlarged view with details of a power divider and an array antenna shown in FIG. 1A.

Please refer to FIG. 1B; FIG. 1B is a schematic diagram illustrating a locally enlarged view with details of the power divider 12 and the array antenna 14. FIG. 1B shows the front of the array antenna 14; however, the whole structure and the overall picture can be easily understood by referring to FIG. 1B together with FIG. 1A. As shown in FIG. 1B, the coupling units 122 is a dual-L resonator and comprises a first long segment 126, a first short segment 128, a second long segment 130 and a second short segment 132. The first long segment 126 and the first short segment 128 constitute an L resonator, and the second long segment 130 and the second short segment 132 constitute another L resonator. The dual-L resonator is symmetrical with respect to a centerline CL2 of the two corresponding L resonators. In addition, as shown in FIG. 1B, the first long segment 126 and the second long segment 130 are substantially parallel to the rectangular microstrip line 120. The shortest distance between the first long segment 126 and the rectangular microstrip line 120 is a first gap d1. One terminal of the second long segment 130 is integrated into the antenna 140 by a coplanar waveguide method and transmits signals by coupling, which may be regarded as an output terminal. The first short segment 128 and the second short segment 132 are respectively perpendicular to the first long segment 126 and the second long segment 130 and extend from the first long segment 126 and the second long segment 130 to the centerline CL2, such that a shortest distance between the first short segment 128 and the second short segment 132 is a second gap d2, and the first short segment 128 and the second short segment 132 transfer energy by capacitive coupling. Furthermore, both of the antennas 140 and 142 are composed of ten radiator elements RAT and nine extending segments BR arranged in a sequence, and signals are transmitted among the radiator elements RAT and the extending segments BR by electromagnetic coupling. More specifically, as shown in FIG. 1B, each of the radiator elements RAT has a shape substantially conforming to a quadrilateral with a first side L1, a second side L2, a third side L3 and a fourth side L4. The first side L1 is substantially parallel to the third side L3. The second side L2 is substantially parallel to the fourth side L4. The first side L1 is substantially perpendicular to the second side L2. Moreover, a first concavity CV1 is formed on the second side L2 of the radiator element RAT so as to couple the array antenna 14 by the co-planar waveguide method. A second concavity CV2 is formed on the fourth side L4 of the radiator element RAT so as to concatenate the radiator elements RAT in a series. Namely, the second long segment 130 extends to the first concavity CV1 of the radiator element RAT located at the front position of the sequence, and the second long segment 130 and the radiator element RAT are separated by a third gap d3 horizontally and a fourth gap d4 vertically. Moreover, the extending segment BR extends from the second concavity CV2 of the radiator element RAT located at the front position of the sequence to the first concavity CV1 of the next radiator element RAT. A radiator sequence composed of the radiator elements RAT and the extending segments BR is thus formed by the same token. What's more, a length of the extending segment BR and a length of the first side L1 or the third side L3 of the radiator element RAT are half of a wavelength corresponding to an operating frequency. In addition, a first L extending portion EXT_1 and a second L extending portion EXT_2 further extend from the first side L1 and the third side L3 of each radiator element RAT in order to adjust parameters for impedance matching, frequency band, etc.

As set forth above, the power divider 12 and the array antenna 14 are coupled with the coplanar waveguide coupling structure so that the extra matching circuits near the joint between the power divider 12 and the array antenna 14 are omitted, thereby effectively minimizing area and reducing transmission loss. During transmission, signals are inputted from the input terminal 16 to the rectangular microstrip line 120, and then coupled to a side of the coupling units 122, 124, which, for example, is the first long segment 126 in the case of the coupling units 122, by lateral coupling. As a result, signal intensity fed from the rectangular microstrip line 120 to the coupling units 122, 124 can be controlled by adjusting the first gap d1. Similarly, a distance between short segments of the dual-L resonator (i.e., the second gap d2) also relates to signal intensity distributed from one L resonator to another L resonator. The coupling units 122, 124 transmit signals to the antennas 140 and 142 by the coplanar waveguide method, so a distance between the coupling unit 122 and the antenna 140 and a distance between the coupling unit 124 and the antenna 142 (i.e. the third gap d3 and the fourth gap d4 if the coupling unit 122 is taken as an example) also relate to signal intensity fed from the coupling units 122, 124 to the antennas 140, 142. Under a likely scenario, those skilled in the art may adjust the first to fourth gaps denoted by d1-d4 properly to control signal intensity fed from the input terminal 16 to the antennas 140, 142 according to different design considerations or system requirements. In general, a higher degree of coupling requires a narrower gap, and a bandwidth is concomitantly getting boarder.

Additionally, lengths of the two L resonators in the coupling units 122, 124 (i.e. a total length of the first long segment 126 and the first short segment 128 or a total length of the second long segment 130 and the second short segment 132 if the coupling unit 122 is concerned) may be respectively half of the wavelength corresponding to the operating frequency. Widths w1, w2 or lengths l1, l2 of the L resonators affect the operating frequency as well. Moreover, antenna concavity dimensions g1, g2, sizes or shapes of the first concavity CV1 and the second concavity CV2, and a distance between the radiator elements RAT may adjust resonant frequencies and intensity of input energy. Therefore, for specific bandwidth, as long as certain coupling coefficients are satisfied, the widths and lengths of the L resonator can be adjusted according to different structures, thereby providing more design flexibility.

Figure 2:
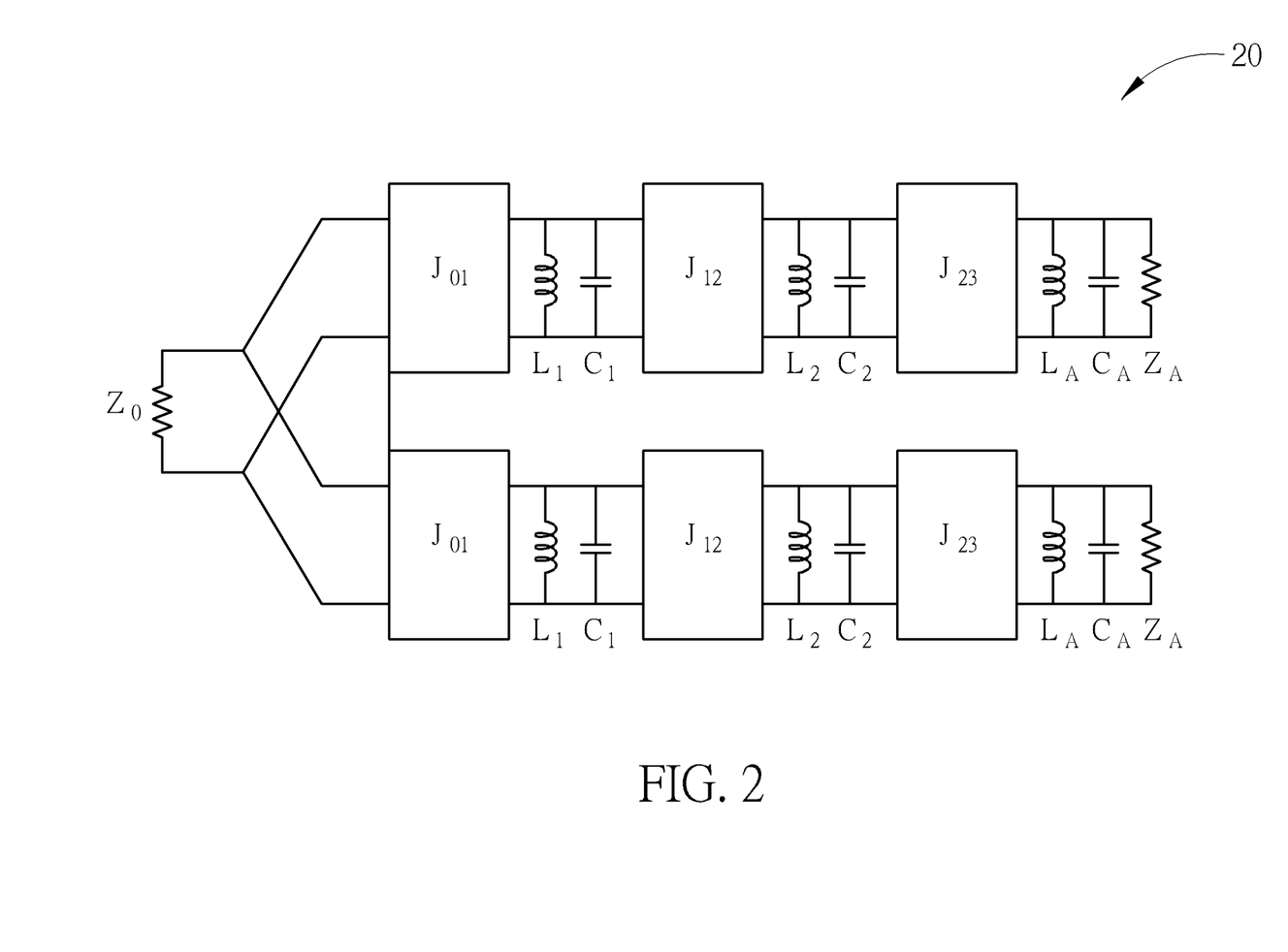
FIG. 2 is a schematic diagram of an equivalent circuit of the radio-frequency device shown in FIG. 1A.

In this case, the radio-frequency device 10 may be modeled as an equivalent circuit 20 shown in FIG. 2. According to FIG. 2, $Z_0$ denotes input impedance of the radio-frequency device 10. An inductor $L_1$ and a capacitor $C_1$ connected in parallel constitute an equivalent circuit of an L resonator (i.e. the L resonator composed of the first long segment 126 and the first short segment 128 if the coupling unit 122 is taken as an example). An inductor $L_2$ and a capacitor $C_2$ connected in parallel constitute an equivalent circuit of another L resonator (i.e. the L resonator composed of the second long segment 130 and the second short segment 132 if the coupling unit 122 is concerned). An impedance $Z_A$, an inductor $L_A$ and a capacitor $C_A$ connected in parallel constitute an equivalent circuit of the antenna 140. Furthermore, coupling coefficients of the rectangular microstrip line 120, the coupling units 122, 124 and the antennas 140, 142 can be modeled as an admittance inverter (i.e. J inverter); that is to say, an admittance $J_{01}$ denotes a coupling coefficient among the rectangular microstrip line 120 and the coupling units 122, 124, an admittance $J_{12}$ denotes a coupling coefficient between the two L resonators in the coupling units 122, 124, and an admittance $J_{23}$ denotes a coupling coefficient among the coupling units 122, 124 and the antennas 140, 142. The equivalent circuit 20 can be analyzed by a filter theory with specification of required resonant frequencies, required bandwidth and so on to produce desired frequency response.

Figure 3:
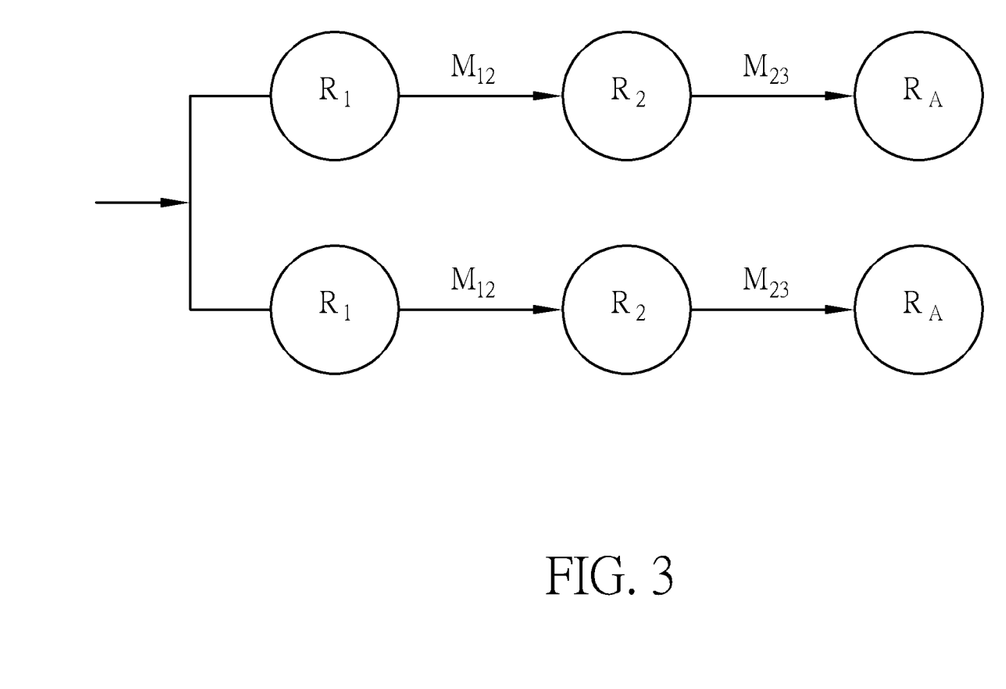
FIG. 3 is a schematic diagram of a functional block diagram of the radio-frequency device shown in FIG. 1A.

Besides, since the lengths of the radiator elements of the antennas 140, 142 (i.e., the length of the first side L1 or the third side L3), the lengths of the extending segments BR and the lengths of the L resonators (i.e., the total length of the first long segment 126 and the first short segment 128 or the total length of the second long segment 130 and the second short segment 132 if the coupling unit 122 is taken as an example) are all half of a wavelength of a signal to be transmitted, the antennas 140, 142 may be regarded as part of the power divider 12, or more specifically, an extension of the L resonators. In this case, the radio-frequency device 10 may be simplified into a functional block diagram as shown in FIG. 3, where $R_1$ and $R_2$ denote functional blocks of the two L resonators in the coupling units 122, 124, $R_A$ denotes a functional block of the antennas 140, 142, $M_{12}$ denotes a coupling coefficient between the two L resonators, and $M_{23}$ denotes a coupling coefficient among the coupling units 122, 124 and the antennas 140, 142. Accordingly, design processes can be effectively simplified.

Figure 4A:
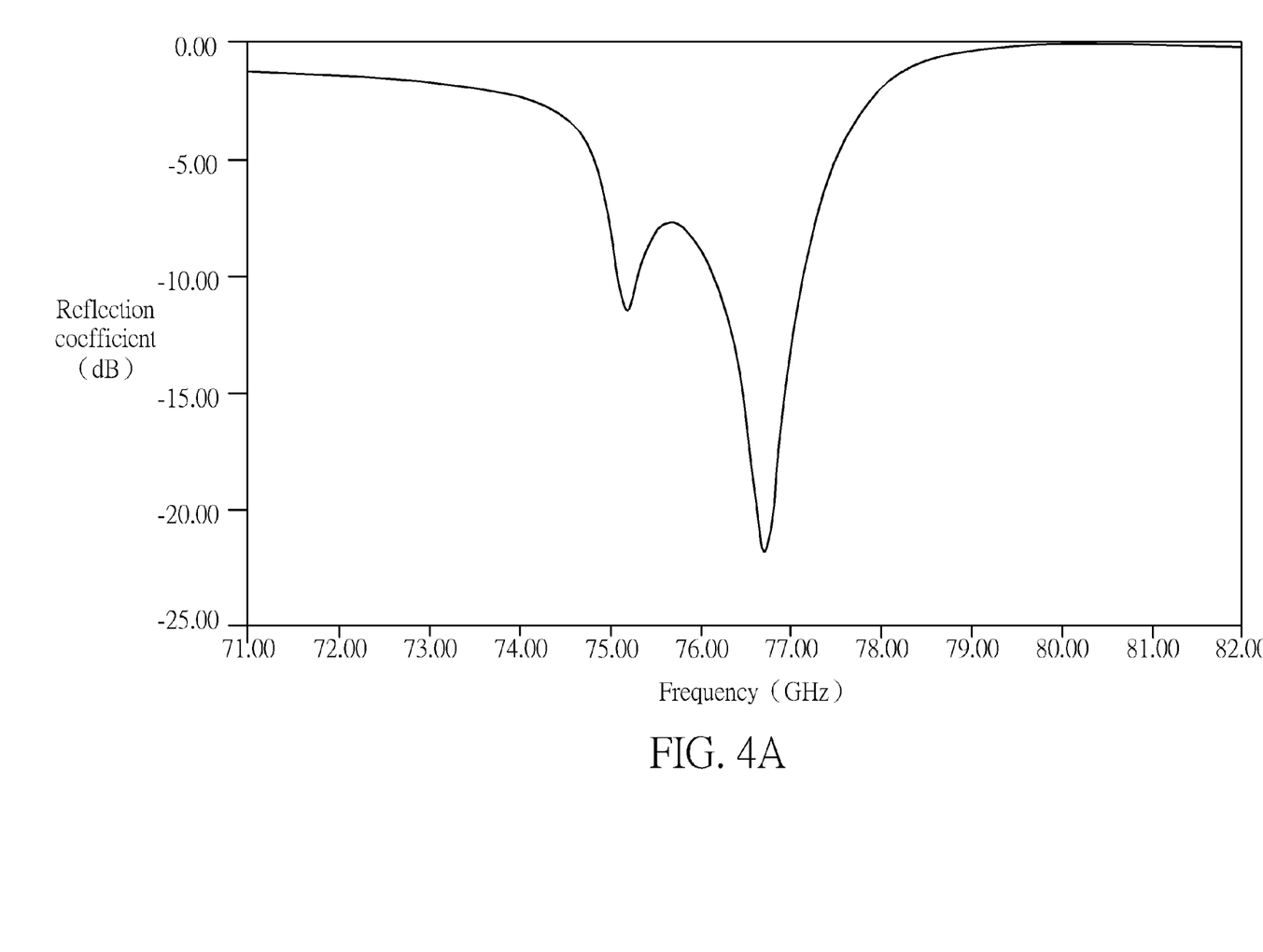
FIG. 4A is a frequency response diagram of the radio-frequency device shown in FIG. 1A.
Figure 4B:
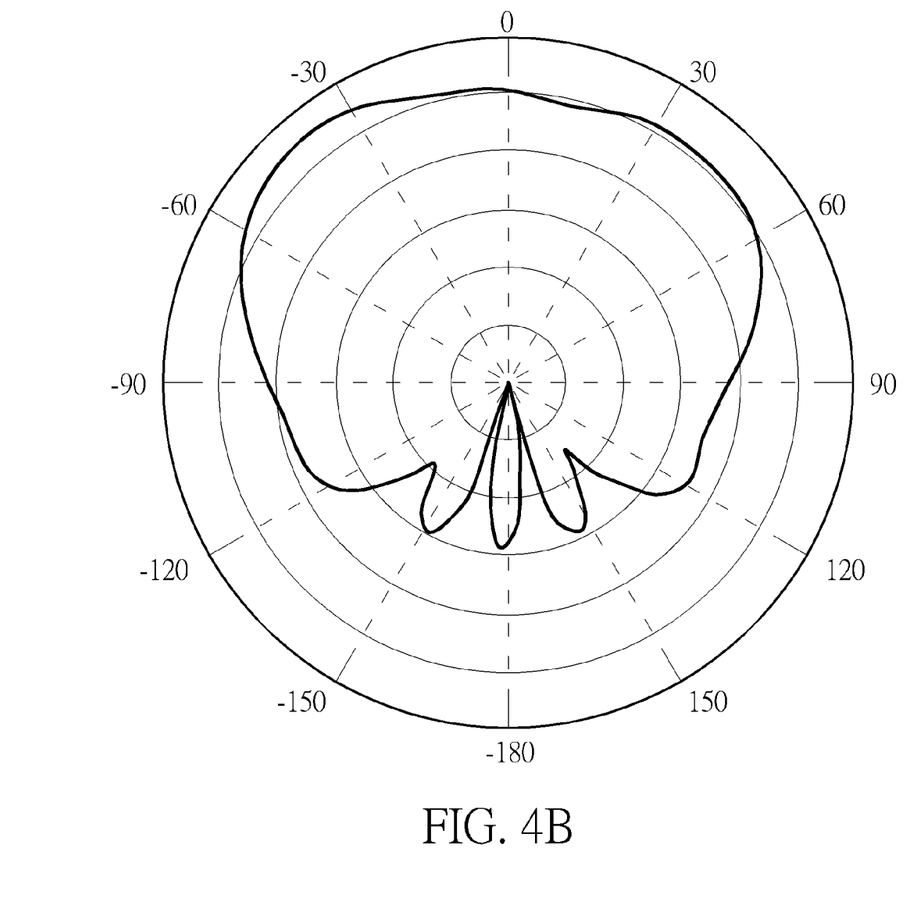
FIG. 4B is a diagram of an azimuth antenna radiation pattern of the radio-frequency device shown in FIG. 1A.
Figure 4C:
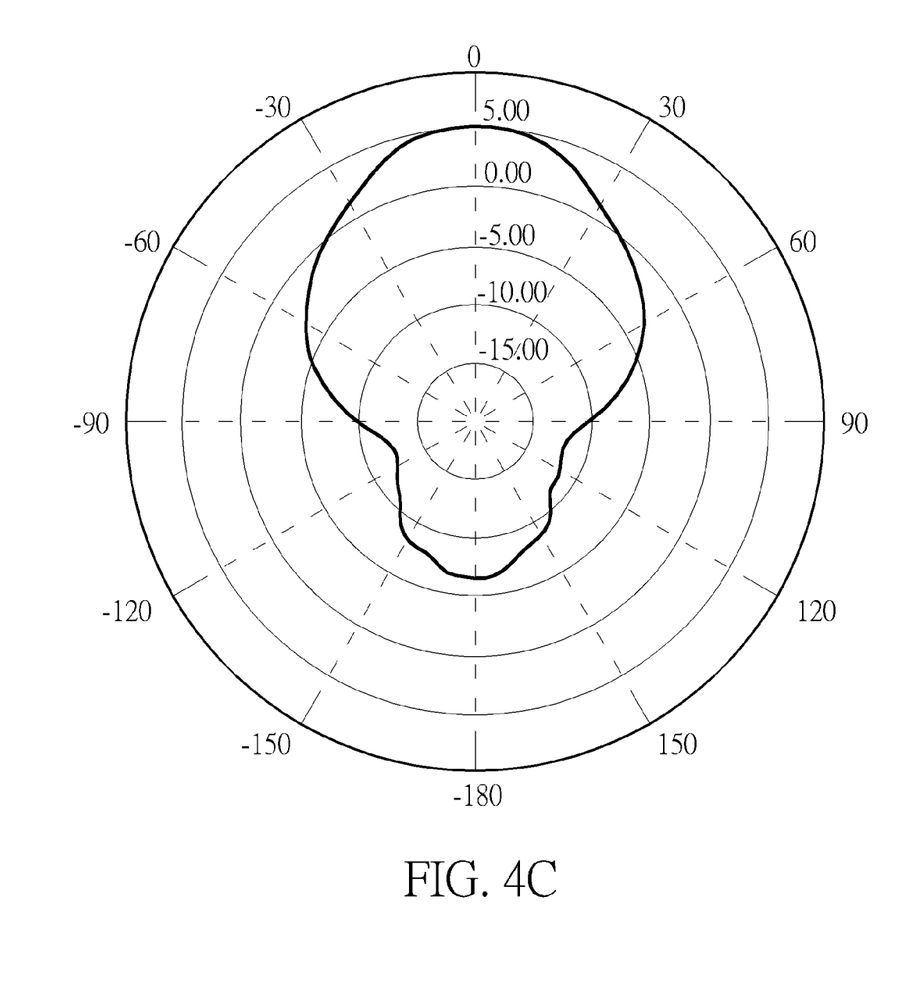
FIG. 4C is a diagram of an elevation angle antenna radiation pattern of the radio-frequency device shown in FIG. 1A.
Figure 4D:
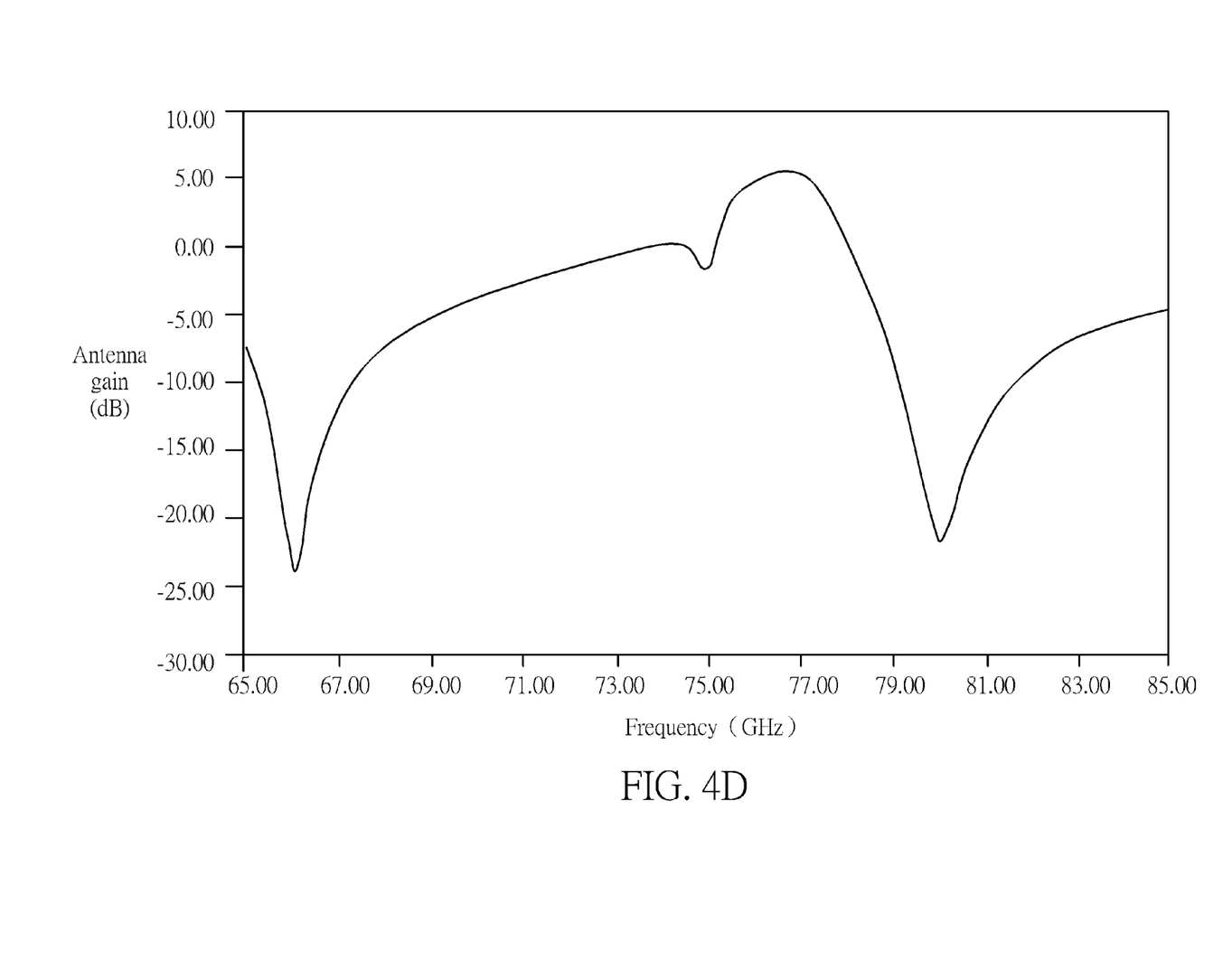
FIG. 4D is a schematic diagram of antenna gains of the radio-frequency device shown in FIG. 1A versus frequency.

For example, if the coupling coefficients $M_{12}$ and $M_{23}$ are required to be in a range of 0.001 to 1, the lengths of the radiator elements of the antennas 140, 142, the lengths of the extending segments BR and the lengths of the L resonators may be set according to frequency of the signals to be transmitted, and the first to fourth gaps d1-d4 can be respectively adjusted into a range of 10 mm to 0.05 mm to provide characteristic diagrams as shown in FIGS. 4A to 4D. FIG. 4A is a frequency response diagram of the radio-frequency device 10. FIG. 4B is a diagram of an azimuth antenna radiation pattern of the radio-frequency device 10. FIG. 4C is a diagram of an elevation antenna radiation pattern of the radio-frequency device 10. FIG. 4D is a schematic diagram of antenna gains of the radio-frequency device 10 versus frequency. As shown in FIG. 4A, because the array antenna 14 is integrated with the power divider 12, the bandwidth can be effectively expanded, and impedance characteristics do not shift even if each is designed individually before concatenated. As shown in FIG. 4C, beams from the array antenna 14 can be collimated effectively. In addition, as shown in FIG. 4D, the radio-frequency device 10 can serve as a filter and has a plurality of transmission zeros; consequently, radiation out of the operating frequency is less to avoid interference and increase the frequency selectivity.

As set forth above, the present invention uses the coupling units 122, 124 to conduct the rectangular microstrip line 120 and the antennas 140, 142 by electromagnetic coupling, and hence the first to fourth gaps d1-d4, the lengths of the two L resonators in the coupling units 122, 124, the widths w1, w2, the lengths l1, l2, the antenna concavity dimensions g1, g2, the sizes or shapes of the first concavity CV1 and the second concavity CV2, and the distance between the radiator elements RAT can be adjusted to control a degree of coupling from the input terminal 16 to the array antennas 140, 142 so that the extra matching circuits near the joint between the power divider 12 and the array antenna 14 are not necessary, thereby effectively minimizing area and reducing the transmission loss.

It is worth noting that the radio-frequency device 10 shown in FIG. 1A is simply an embodiment of the present invention, but the present invention is not limited thereto and those skilled in the art might make modifications or alterations accordingly. For example, the second concavity CV2 is designed to facilitate arrangement of the extending segment BR and the radiator element RAT concatenated in a series; nevertheless, the second concavity CV2 may not be necessary in an embodiment with only one single radiator element RAT or when available space is limited. Similarly, the first concavity CV1 can be removed. Moreover, in the radio-frequency device 10, the input terminal 16 may be a signal pin, a via, etc. and is directly connected or electrically connected to the rectangular microstrip line 120; namely, the signals of the input terminal 16 are directly fed into the rectangular microstrip line 120. In addition, the input terminal 16 may be coupled to the rectangular microstrip line 120 via a coupling element by electromagnetic coupling. As shown in FIGS. 1A and 1B, the dual-L resonator (i.e., the coupling units 122, 124) is disposed with long segments substantially arranged in line; however, the present invention is not restricted thereto and may be modified appropriately according to different design considerations or system requirements. What's more, in the radio-frequency device 10, the array antenna 14 is a 2×10 array antenna; that is, the array antenna 14 comprises two sub-array antennas (or antenna sequences), and each of the sub-array antennas comprises ten radiator elements. However, the present invention is not restricted thereto and those skilled in the art may either increase or decrease the number of the radiator elements in each sub-array antenna (e.g. to be greater than or equal to 1), or increase the number of the sub-array antennas accordingly.

Figure 5:
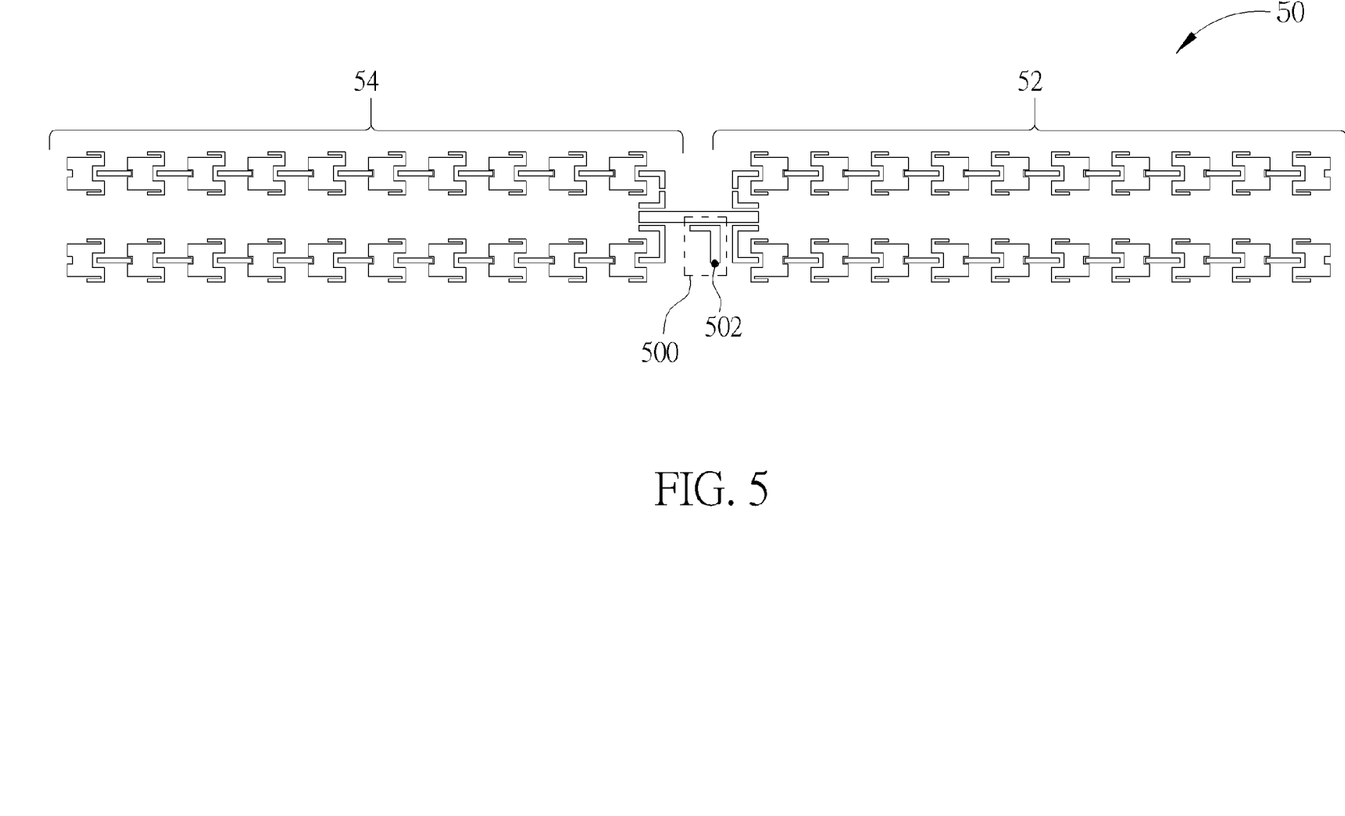
FIG. 5 is a schematic diagram of a radio-frequency system according to an embodiment of the present invention.

For example, please refer to FIG. 5, which is a schematic diagram illustrating a radio-frequency system 50 according to an embodiment of the present invention. The radio-frequency system 50 is a 4×10 array antenna and comprises radio-frequency devices 52, 54 and a coupling element 500. By comparing FIG. 5 to FIG. 1A, it is obvious that the radio-frequency device 52 is identical to the radio-frequency device 10, and the radio-frequency device 54 is a mirror result of the radio-frequency device 52; therefore, related operation can refer to the aforementioned illustrations and the extra matching circuits near the joint between the power divider and the array antenna may also be omitted, hence effectively minimizing area and reducing the transmission loss. Besides, one terminal of the coupling element 500 is electrically connected to an input terminal 502, and signals are fed into a rectangular microstrip line shared by the radio-frequency devices 52, 54 by electromagnetic coupling. Furthermore, please refer to FIG. 6, which is a schematic diagram of a radio-frequency system 60 according to an embodiment of the present invention. The radio-frequency system 60 is an 8×10 array antenna, which comprises radio-frequency devices 62, 64 and a coupling element 600. By comparing FIG. 6 to FIG. 5, it is apparent that the radio-frequency devices 62, 64 are identical to the radio-frequency device 50, and the radio-frequency device 62 is a mirror result of the radio-frequency device 64; as a result, related operation can refer to the aforementioned illustrations and the extra matching circuits near the joint between the power divider and the array antenna may also be omitted, thereby effectively minimizing area and reducing the transmission loss. What's more, one terminal of the coupling element 600 is electrically connected to an input terminal 602, and signals are fed into a rectangular microstrip line of the radio-frequency device 62 and that of the radio-frequency device 64 by electromagnetic coupling.

The above-mentioned radio-frequency systems 50, 60 illustrate that the present invention may derive embodiments of multiple array antennas in order to collimate radiation beams in a required direction, thus enhancing directivity and enabling long-distance transmission. Moreover, as set forth above, the radio-frequency device 10 has a great deal of adjustable parameters, and hence, by adjusting these parameters, signal power assigned to each of the sub-array antennas would reach a specific ratio. For example, in one embodiment, by adjusting gaps, energy distribution of the four sub-array antennas from top to bottom in the radio-frequency system 60 shown in FIG. 6 may be in a ratio of (0.00~10.1): 1:1:(0.00~10.1); namely, the signal power is mainly distributed around the two sub-array antennas in the middle.

Figure 7:
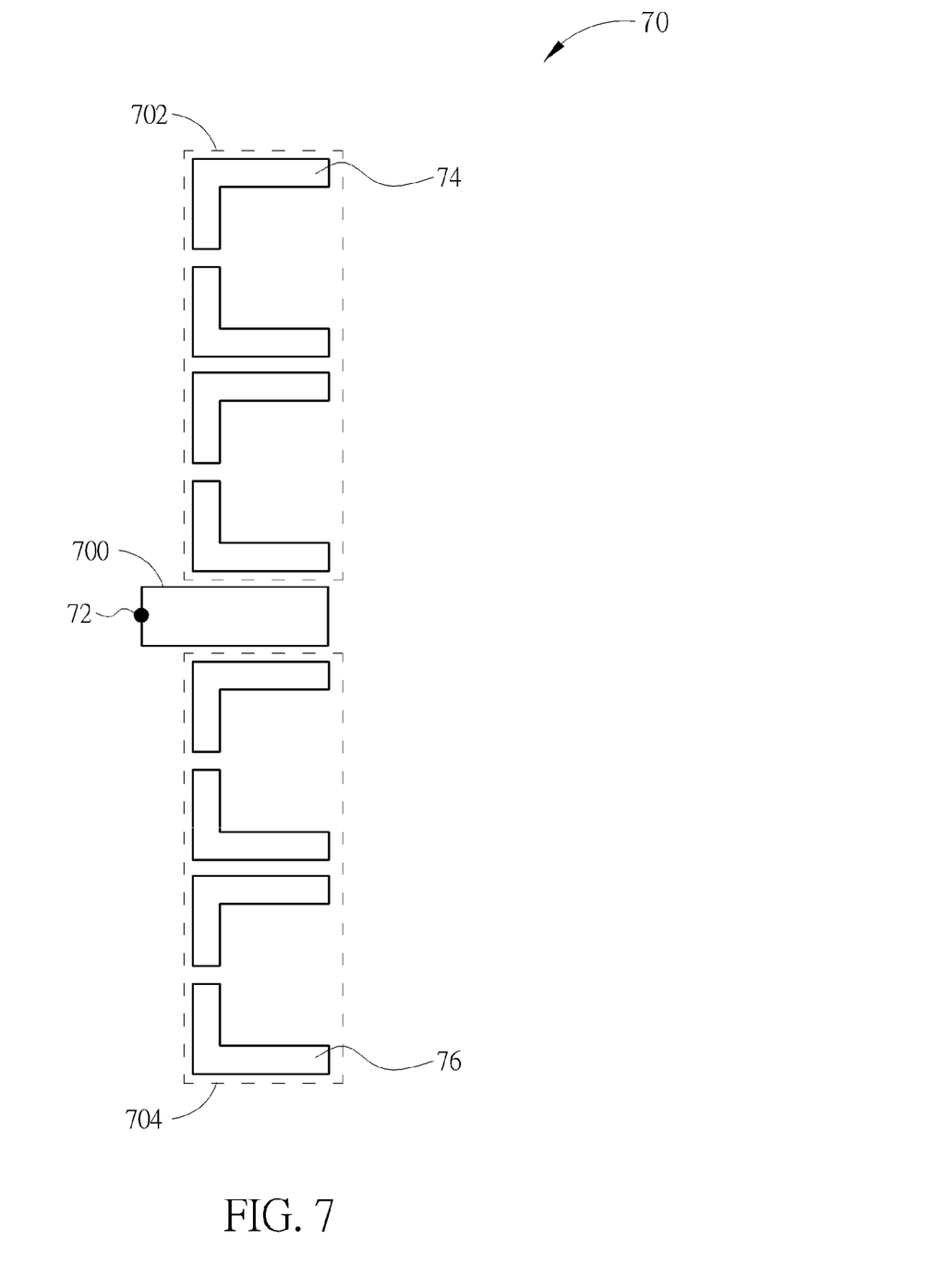
FIG. 7 is a schematic diagram of a power divider according to an embodiment of the present invention.

Furthermore, in the aforementioned embodiments, each of the coupling units, such as the coupling units 122, 124 shown in FIG. 1A, merely comprises a dual-L resonator; that is, each of the coupling units comprises three orders of adjustable coupling coefficients depending on the gaps d1-d3 (i.e., the admittances $J_{01}$, $J_{12}$, $J_{23}$ as shown in FIG. 2). However, the present invention is not limited thereto, and in other embodiments, each of the coupling units may also be composed of a plurality of dual-L resonators. For example, FIG. 7 is a schematic diagram of a power divider 70 according to an embodiment of the present invention. The power divider 70 is configured to allocate signals from an input terminal 72 to output terminals 74, 76 and can replace the power divider 12 shown in FIG. 1A. A structure of the power divider 70 is similar to that of the power divider 12, and the power divider 70 comprises a rectangular microstrip line 700 and coupling units 702, 704 as well. A difference between the power divider 70 and the power divider 12 is that the coupling units 702, 704 respectively comprise two dual-L resonators. In other words, the power divider 70 has two more order of adjustable coupling coefficients compared to the power divider 12, and thus provides more design flexibility to satisfy different system requirements. Besides, long segments of dual-L resonators in the power divider 70 are substantially arranged in line but not limited thereto—the long segments of the dual-L resonators may be slightly misaligned according to different design considerations or system requirements.

Figure 6:
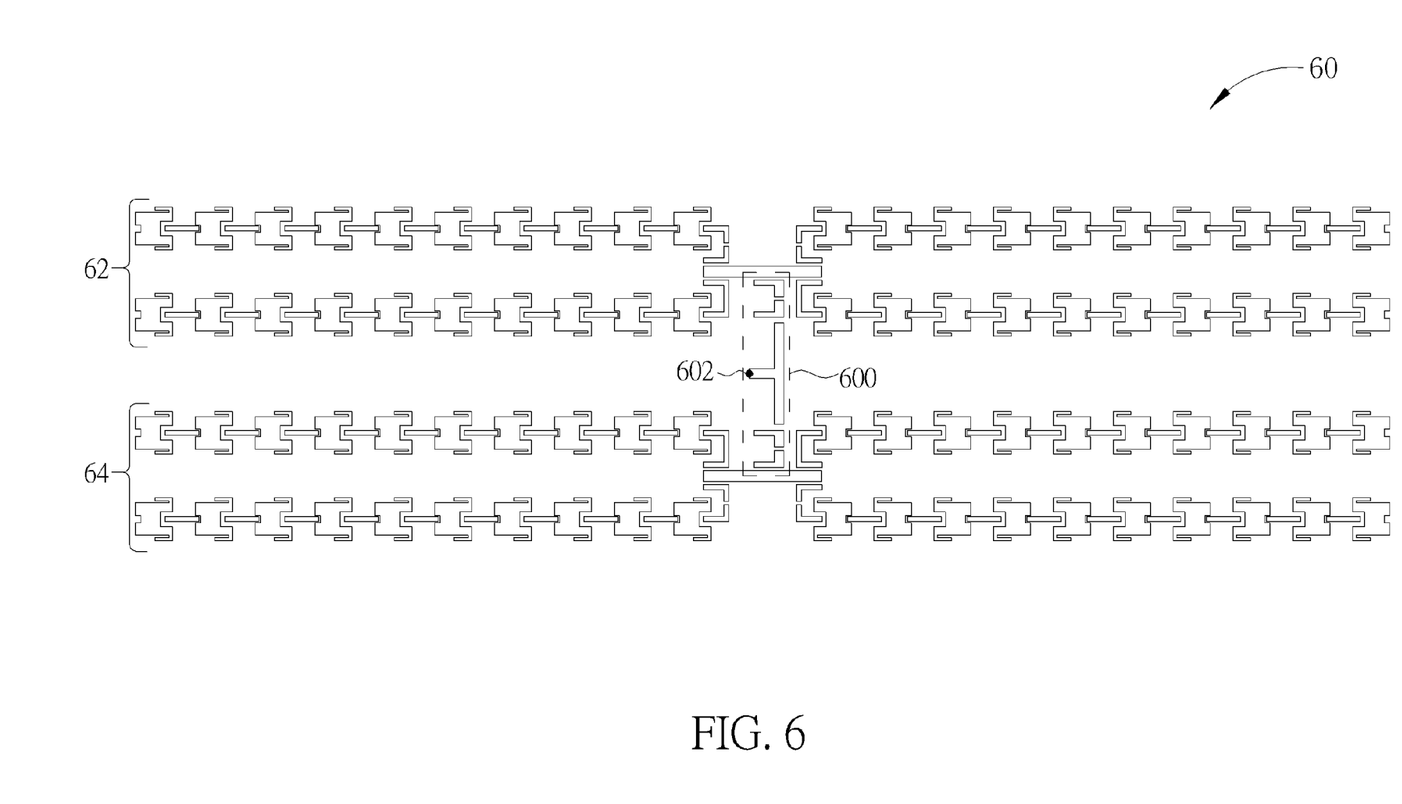
FIG. 6 is a schematic diagram of a radio-frequency system according to an embodiment of the present invention.
Figure 8A:
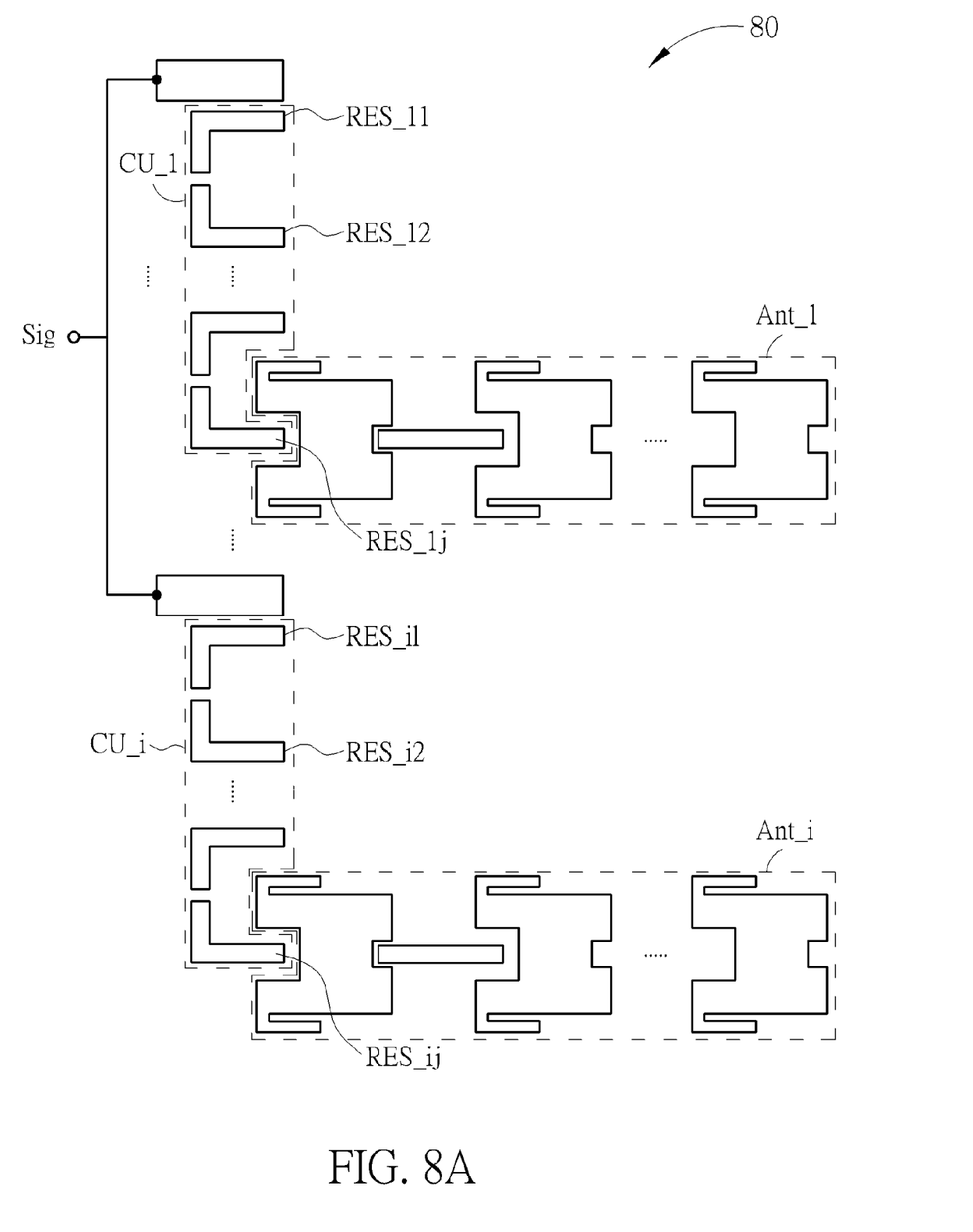
FIG. 8A is a schematic diagram of a radio-frequency system according to an embodiment of the present invention.
Figure 8B:
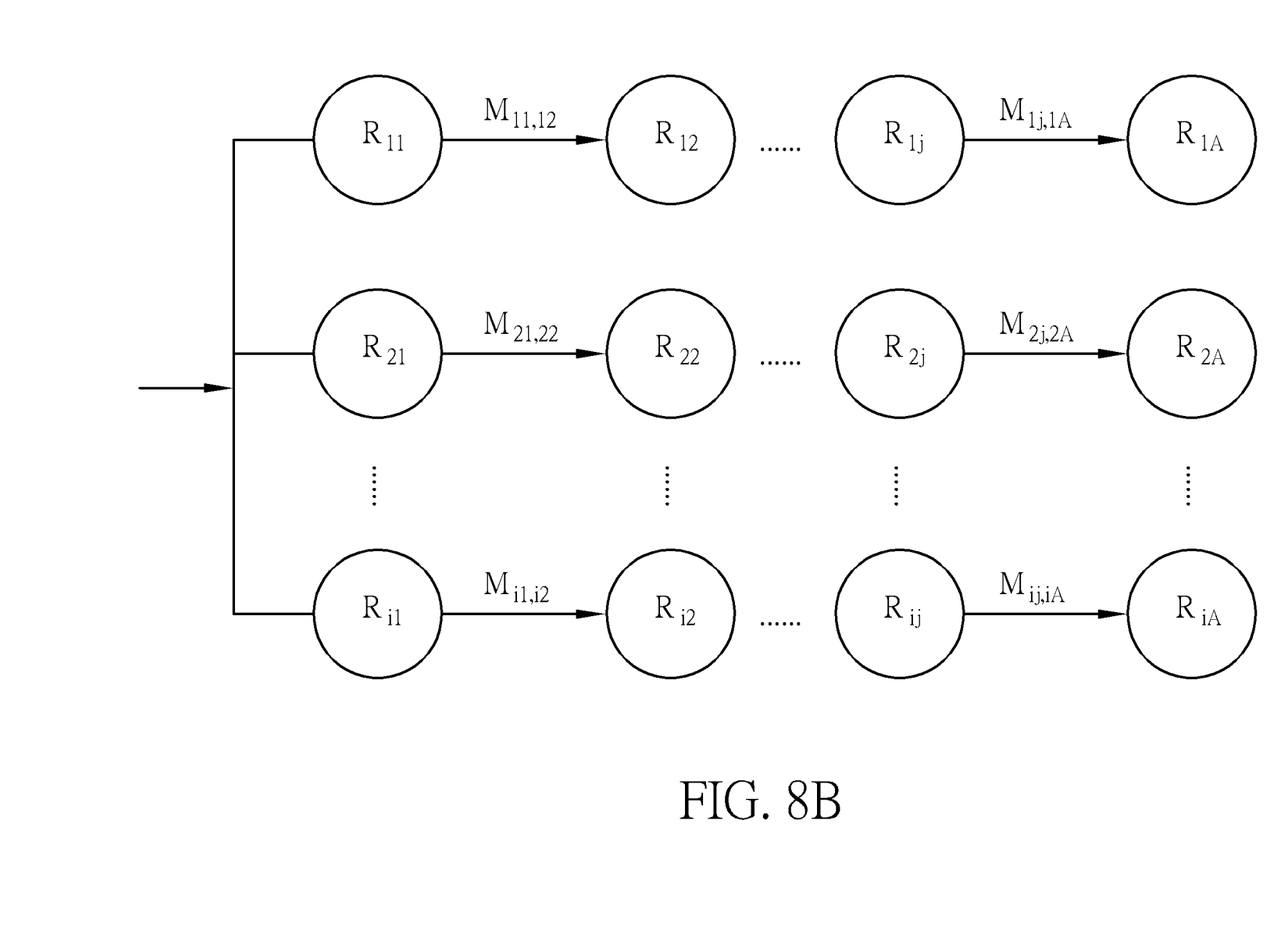
FIG. 8B is a schematic diagram of a functional block diagram of the radio-frequency device shown in FIG. 8A.

Continuing with the embodiment shown in FIG. 7 and following a manner in which sub-array antennas are added as shown in FIG. 5 and FIG. 6, a 1×i radio-frequency device 80 of j order of coupling coefficients is derived as shown in FIG. 8A. In the radio-frequency device 80 as shown in FIG. 8A, an input signal Sig is transmitted to i pieces of antennas Ant_1-Ant_i via coupling units CU_1-CU_i, and each of the coupling units comprises j pieces of L resonators RES_11-RES_1j, . . . , RES_i1-RES_ij. Therefore, a functional block diagram of the radio-frequency device 80 is as shown in FIG. 8B, where $R_{11}$-$R_{ij}$ denote functional blocks of i×j pieces of the L resonators, $R_{1A}$-$R_{iA}$ denote functional blocks of the antennas Ant_1-Ant_i, $M_{11,12}$-$M_{ij,ij}$ denote coupling coefficients between the L resonators, and $M_{1j,1A}$-$M_{ij,iA}$ denote coupling coefficients between the coupling units CU_1-CU_i and the antennas Ant_1-Ant_i.

The radio-frequency device 80 is derived from the above-mentioned embodiments and has more order of the L resonators for providing more design flexibility. Related alterations or modifications can be made according to the aforementioned illustration as above and hence are not detailed redundantly.

To sum up, the rectangular microstrip line and the antennas are conducted via the coupling units by electromagnetic coupling in the present invention, so the gap, the length and the width of each element, the size or shape of the concavity, the distance between the radiator elements and so on can be modified to control the degree of coupling from the input terminal to the array antenna so that extra matching circuits near the joint between the power divider and the array antenna are not necessary, thereby effectively minimizing area and reducing transmission loss. Moreover, the power divider can serve as a filter so as to increase frequency selectivity and be isolated from undesirable signal sources.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. A power divider, for transmitting signals of an input terminal to a plurality of output terminals, the power divider comprising:
   a rectangular microstrip line, coupled to the input terminal; and
   a plurality of coupling units, conducting the rectangular microstrip line and the plurality of output terminals by electromagnetic coupling, wherein each of the plurality of coupling units and the rectangular microstrip line are separated by a first gap, each of the plurality of coupling units comprises at least one dual-L resonator disposed between the rectangular microstrip line and an output terminal of the plurality of output terminals, and each of the at least one dual-L resonator comprises:
      a first long segment, substantially parallel to the rectangular microstrip line;
      a first short segment, substantially perpendicular to the first long segment and extending from a terminal of the first long segment to a centerline of the dual-L resonator;
      a second long segment, substantially parallel to the rectangular microstrip line; and
      a second short segment, substantially perpendicular to the second long segment, extending from a terminal of the second long segment to the centerline, facing a terminal of the first short segment, and located apart from the terminal of the first short segment by a second gap;
   wherein a first long segment of the at least one dual-L resonator is adjacent to the rectangular microstrip line, and a second long segment of the at least one dual-L resonator is coupled to the output terminal;
   wherein the first gap and the second gap are related to power ratios between the input terminal and the plurality of output terminals.

2. The power divider of claim 1, wherein the rectangular microstrip line is coupled to the input terminal by means of direct connecting.

3. The power divider of claim 1, further comprising a coupling element, electrically connected to the input terminal and coupled to the rectangular microstrip line by electromagnetic coupling, such that the rectangular microstrip line is coupled to the input terminal through the coupling element.

4. The power divider of claim 1, wherein the at least one dual-L resonator is disposed between the rectangular microstrip line and the plurality of output terminals with long segments substantially arranged in line.

5. A radio-frequency device, comprising:
   a power divider, for transmitting signals of an input terminal to a plurality of output terminals, the power divider comprising:
      a rectangular microstrip line, coupled to the input terminal; and
      a plurality of coupling units, conducting the rectangular microstrip line and the plurality of output terminals by electromagnetic coupling, wherein each of the plurality of coupling units and the rectangular microstrip line are separated by a first gap, each of the plurality of coupling units comprises at least one dual-L resonator disposed between the rectangular microstrip line and an output terminal of the plurality of output terminals, and each of the at least one dual-L resonator comprises:
         a first long segment, substantially parallel to the rectangular microstrip line;
         a first short segment, substantially perpendicular to the first long segment and extending from a terminal of the first long segment to a centerline of the dual-L resonator;
         a second long segment, substantially parallel to the rectangular microstrip line; and
         a second short segment, substantially perpendicular to the second long segment, extending from a terminal of the second long segment to the centerline, facing a terminal of the first short segment, and located apart from the terminal of the first short segment by a second gap;
      wherein a first long segment of the at least one dual-L resonator is adjacent to the rectangular microstrip line, and a second long segment of the at least one dual-L resonator is coupled to the output terminal;
   a plurality of antennas, coupled to the plurality of output terminals, each of the plurality of the antennas comprising:
      a plurality of radiator elements, wherein each of the plurality of the radiator elements is substantially quadrilateral and has a first side, a second side, a third side and a fourth side, the first side is substantially parallel to the third side, the second side is substantially parallel to the fourth side, and the first side is substantially perpendicular to the second side, wherein a first concavity is formed on the second side of each of the plurality of the radiator elements, and a second concavity is formed on the fourth side of each of the plurality of the radiator elements; and
      a plurality of extending segments, each extending from the second concavity of the fourth side of one of the plurality of radiator elements to the first concavity of the second side of another one of the plurality of radiator elements such that the plurality of radiator elements are arranged in a sequence;
      wherein the first concavity of the second side of a radiator element located at a first place of the sequence and one of the plurality of output terminals are separated by a third gap;
   wherein the first gap, the second gap and the third gap are related to power ratios between the input terminal and the plurality of output terminals.

6. The radio-frequency device of claim 5, wherein the rectangular microstrip line is coupled to the input terminal by means of direct connecting.

7. The radio-frequency device of claim 5, the power divider further comprises a coupling element electrically connected to the input terminal and coupled to the rectangular microstrip line by electromagnetic coupling, such that the rectangular microstrip line is coupled to the input terminal through the coupling element.

8. The radio-frequency device of claim 5, wherein the at least one dual-L resonator is disposed between the rectangular microstrip line and the plurality of output terminals with long segments substantially arranged in line.

9. The radio-frequency device of claim 5, wherein each of the plurality of the radiator elements of each of the plurality of the antennas further comprises:
   a first L extending portion, extending from the first side with a long side parallel to the first side; and
   a second L extending portion, extending from the third side with a long side parallel to the third side.

10. The radio-frequency device of claim 5, wherein each of the plurality of the extending segments conducts two of the plurality of the radiator elements adjacent to each other by electromagnetic coupling.

* * * * *